United States Patent [19]
Yoeli et al.

[11] Patent Number: 5,565,758
[45] Date of Patent: Oct. 15, 1996

[54] MAPPING OF GATE ARRAYS

[75] Inventors: Uzi Yoeli; Meir Janai; Zvi Orbach, all of Haifa, Israel

[73] Assignee: Chip Express (Israel) Ltd., Haifa, Israel

[21] Appl. No.: 429,701

[22] Filed: Apr. 27, 1995

[30] Foreign Application Priority Data

Nov. 21, 1994 [IL] Israel ......................................... 111708

[51] Int. Cl.$^6$ ................................................. H03K 19/177
[52] U.S. Cl. ............................... 326/41; 326/47; 257/211
[58] Field of Search ................................. 326/39–41, 47, 326/101; 257/202, 206, 208, 210, 211

[56] References Cited

U.S. PATENT DOCUMENTS

| | | | |
|---|---|---|---|
| 4,623,911 | 11/1986 | Pryor | 357/45 |
| 4,875,971 | 10/1989 | Orbach et al. | |
| 4,924,287 | 5/1990 | Orbach. | |
| 4,933,738 | 6/1990 | Orbach et al. | |
| 4,960,729 | 10/1990 | Orbach et al. | |
| 4,999,698 | 3/1991 | Okuno et al. | 357/45 |
| 5,049,969 | 9/1991 | Orbach et al. | |
| 5,111,273 | 5/1992 | Orbach et al. | |
| 5,138,194 | 8/1992 | Yoeli. | |
| 5,155,065 | 10/1992 | Schweiss | 437/209 |
| 5,260,597 | 11/1993 | Orbach et al. | |
| 5,329,152 | 7/1994 | Janai et al. | |
| 5,367,187 | 11/1994 | Yuen | 257/401 |
| 5,384,472 | 1/1995 | Yin | 257/204 |
| 5,399,517 | 3/1995 | Ashtaputre et al. | 437/51 |
| 5,404,033 | 4/1995 | Wong et al. | 257/202 |
| 5,406,138 | 4/1995 | Srinivasan et al. | 326/41 |

*Primary Examiner*—David R. Hudspeth
*Attorney, Agent, or Firm*—Browdy and Neimark

[57] ABSTRACT

This invention discloses a gate array device, useful either as a configurable gate array device or a compact gate array device, comprising an array of two-gate logic cells arranged in columns, a metal grid interconnecting said logic cells into clusters of macrocells, said grid comprising a bottom metal layer and at least one metal layer disposed over the bottom metal layer, power and ground lines formed of said bottom metal layer, extending generally parallel to said columns and a routing grid interconnecting said clusters of macrocells, said routing grid comprising parallel metal tracks crossing said columns of logic cells, and wherein no more than two of said parallel metal tracks are employed to connect to each logic cell.

6 Claims, 5 Drawing Sheets

MAPPING OF GATE ARRAYS

FIELD OF THE INVENTION

The present invention relates to semiconductor devices generally and more particularly to gate arrays.

BACKGROUND OF THE INVENTION

A great variety of gate arrays are known in the prior art. Configurable gate arrays, including particularly laser configurable gate arrays, are also known and are used in prototype and short run applications. The following U.S. Patents of the present applicant/assignee relate to configurable gate arrays: U.S. Pat. Nos. 4,875,971; 4,924,287; 4,933,738; 4,960,729; 5,049,969; 5,111,273; 5,138,194; 5,260,597; 5,329,152.

Generally in the prior art, in order to be conveniently laser configurable, the configuration of the logic cells and their contacts in configurable gate arrays is such that the overall density is relatively low, thus rendering such gate arrays uneconomical for mass applications.

SUMMARY OF THE INVENTION

The present invention seeks to provide a multi-layer random logic gate array device which is laser configurable or single mask configurable for prototyping and low volume production, and is densifiable into a compact design for economic high volume production.

The present invention provides a technique for producing initially a multi-layer random logic gate array device which is laser configurable or single mask configurable for prototyping and thereafter, using the design of the configurable device automatically and without changing the design rules of the device, densifying the configurable device to produce a compact design for economic high volume production.

In accordance with a preferred embodiment of the present invention, densification, also referred to interchangeably as mapping, preserves the relative positions of the logic macrocells of the configurable device in the compact device. Accordingly redesign of the configurable device is not required for densification. The resulting compact device is of generally identical functionality, performance and timing to the non-densified configurable device.

There is thus provided in accordance with a preferred embodiment of the present invention a compact gate array comprising:

a multiplicity of interconnected logic sites;

an electrical signal input and an electrical signal output associated with the multiplicity of interconnected logic sites, and wherein the multiplicity of interconnected logic sites includes at least one axial array of logic sites which includes a plurality of electrical pathways which are mutually interconnected and at least one electrical pathway which is not connected to the plurality of electrical pathways.

Additionally in accordance with a preferred embodiment of the present invention there is provided a gate array device, useful either as a configurable gate array device or a compact gate array device, comprising:

an array of two-gate logic cells arranged in columns;

a metal grid interconnecting said logic cells into clusters of macrocells, said grid comprising a bottom metal layer and at least one metal layer disposed over the bottom metal layer;

power and ground lines formed of said bottom metal layer, extending generally parallel to said columns; and a routing grid interconnecting said clusters of macrocells, said routing grid comprising parallel metal tracks crossing said columns of logic cells, and wherein no more than two of said parallel metal tracks are employed to connect to each logic cell.

Further in accordance with a preferred embodiment of the present invention there is provided a compact gate array device comprising:

an array of logic cells arranged in columns, each including at least one channel, said logic cells each comprising a plurality of regions of implanted semiconductor material, said regions being separated from each other by conducting gates; and a metal grid interconnecting said logic cells and comprising at least two metal layers, said grid being connected to said regions of implanted semiconductor material at a plurality of generally uniformly sized contact sites, which are arranged in mutually staggered relationship along each channel within each logic cell.

Preferably, the length of each channel is less than the number of contact sites in each channel multiplied by their dimension parallel to the channel.

Additionally in accordance with a preferred embodiment of the present invention there is provided a compact gate array device comprising:

an array of logic cells arranged in columns, each including at least one channel, said logic cells each comprising a plurality of regions of implanted semiconductor material, said regions being separated from each other by conducting gates; and a metal grid interconnecting said logic cells and comprising at least two metal layers, said grid being connected to said regions of implanted semiconductor material at selected ones of a plurality of generally uniformly sized allowed contact sites, the number of said allowed contact sites along any line parallel to said columns being less than the number of implanted semiconductor regions along said line.

Further in accordance with the preceding embodiment of the invention, intermediate each pair of contact sites along each such line parallel to said columns there exists at least one isolated region whose dimension along said line is too short to accommodate a contact site thereat.

Additionally in accordance with a preferred embodiment of the present invention there is provided a compact gate array device comprising:

an array of logic cells arranged in columns, each including at least one channel, said logic cells each comprising a plurality of regions of implanted semiconductor material, said regions being separated from each other by conducting gates; and a metal grid interconnecting said logic cells and comprising at least two metal layers, said grid being connected to said regions of implanted semiconductor material at a plurality of generally uniformly sized contact sites, said at least two metal layers being interconnected at a plurality of generally uniformly sized via sites, and wherein the length of said columns is less than the number of said implant regions along a line parallel to said columns multiplied by the length of each implant region along such line.

Further in accordance with a preferred embodiment of the present invention there is provided a method of producing a high density gate array including:

provilding a programmable gate array;

programming the gate array;

following programming of the gate array, modifying a computer file of the gate array as laser programmed, thereby to produce a modified computer file of a programmed gate array wherein at least one metal layer of the gate array is reconfigured so as to increase the density thereof; and employing the modified computer file to mass produce high density programmed gate arrays.

Preferably, programming of the programmable gate array may be done by various techniques, such as by laser or photolithography.

Additionally in accordance with a preferred embodiment of the present invention there is provided a method of mapping a relatively less compact gate array device into a relatively more compact gate array device including:

providing a relatively less compact gate array having a plurality of logic cells arranged along a given axis and a metal interconnect grid including a plurality of metal layers interconnected by vias at via sites, wherein each logic cell has a length spanning n via sites;

mapping said relatively less compact gate array onto a relatively more compact gate array wherein each logic cell has a length spanning no more than n–½ via sites. Preferably, n may equal 4, 3½ or 3.

Preferably, each of the logic cells in the relatively more compact gate array comprises a plurality of transistors whose width is reduced as compared with the width of a plurality of transistors employed in the logic cells of the relatively less compact gate array.

Further in accordance with a preferred embodiment of the present invention there is provided a method of mapping a relatively less compact gate array device having a first plurality of gates into a relatively more compact gate array device having a second plurality of gates, less than the first plurality, the method including:

providing a relatively less compact gate array having a first plurality of gates and covering a first rectangular area;

utilizing a third plurality of gates in the relatively less compact gate array, said third plurality being less than or equal to said second plurality and being arranged within a rectangular block of area less than the first rectangular area; and mapping the third plurality of gates to a relatively more compact gate array device having an area less than the or equal to the area of said rectangular block.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
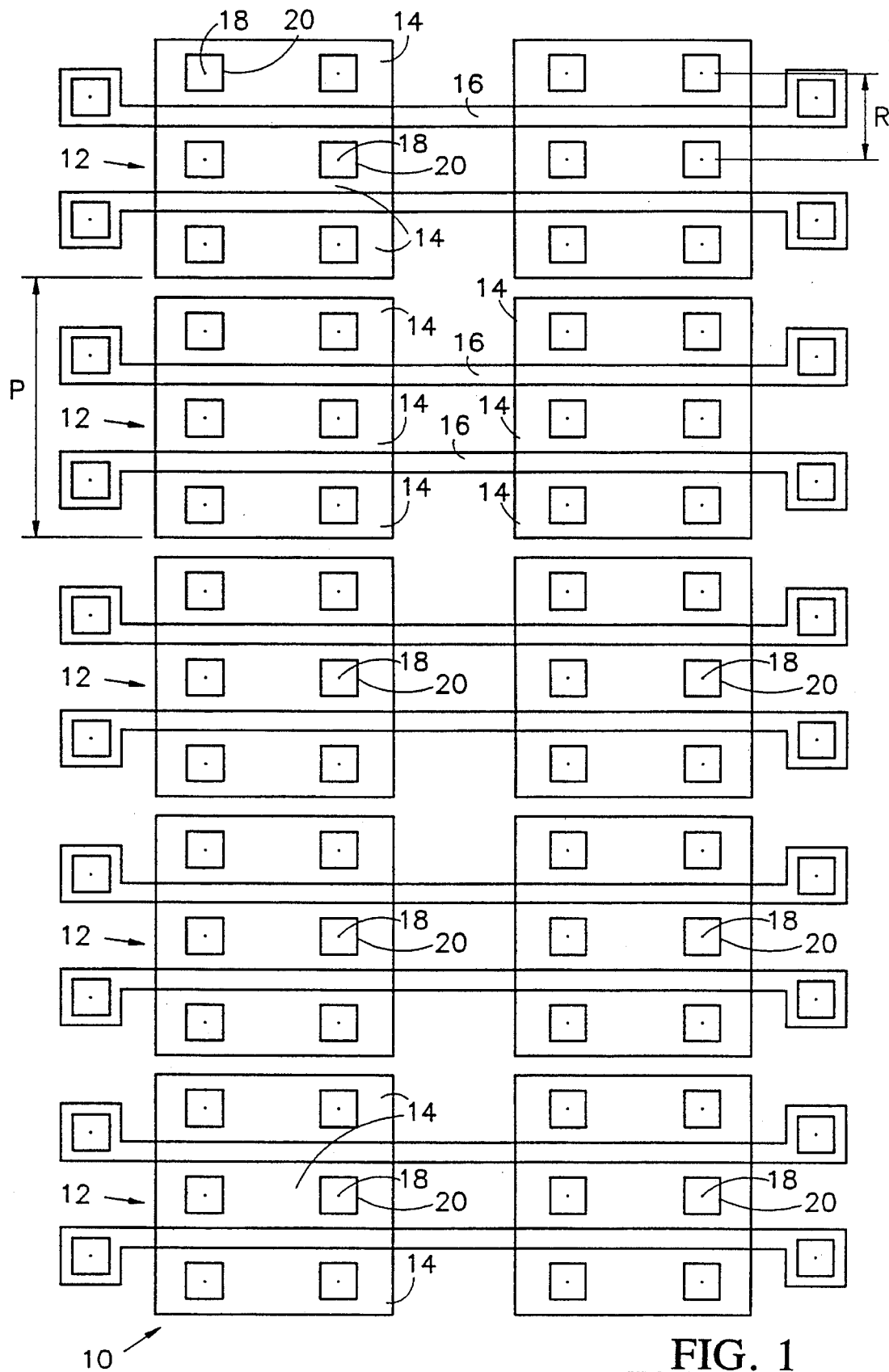
FIG. 1 is a simplified illustration of part of a prior art gate array device.

Reference is now made to FIG. 1, which is an illustration of part of a prior art gate array device, such as that described in "Principles of CMOS VLSI Design" by N. H. E. Weste and K. Eshraghian, Addison-Wesley, 1986, p. 242, FIG. 6.2.c. What is shown in FIG. 1 is a column 10 of two-gate logic cells 12, wherein the pitch of the logic cells 12 along the column 10 is given as P.

Each logic cell 12 includes a plurality of regions 14 of implanted semiconductor material which are separated from each other by conducting gates 16. The regions 14 of implanted semiconductor material communicate with a pair of contacts 18 located at contact sites 20. The number of parallel contact sites within each region 14, may be 3, 4, 5, 6 or more. (In the referenced prior art, 6 sites are shown).

It is noted that in the prior art, the pitch P of a logic cell having three regions 14 along column 10 is greater than or equal to three times the length R of a region 14 plus two gates 16 along column 10.

Figure 2:
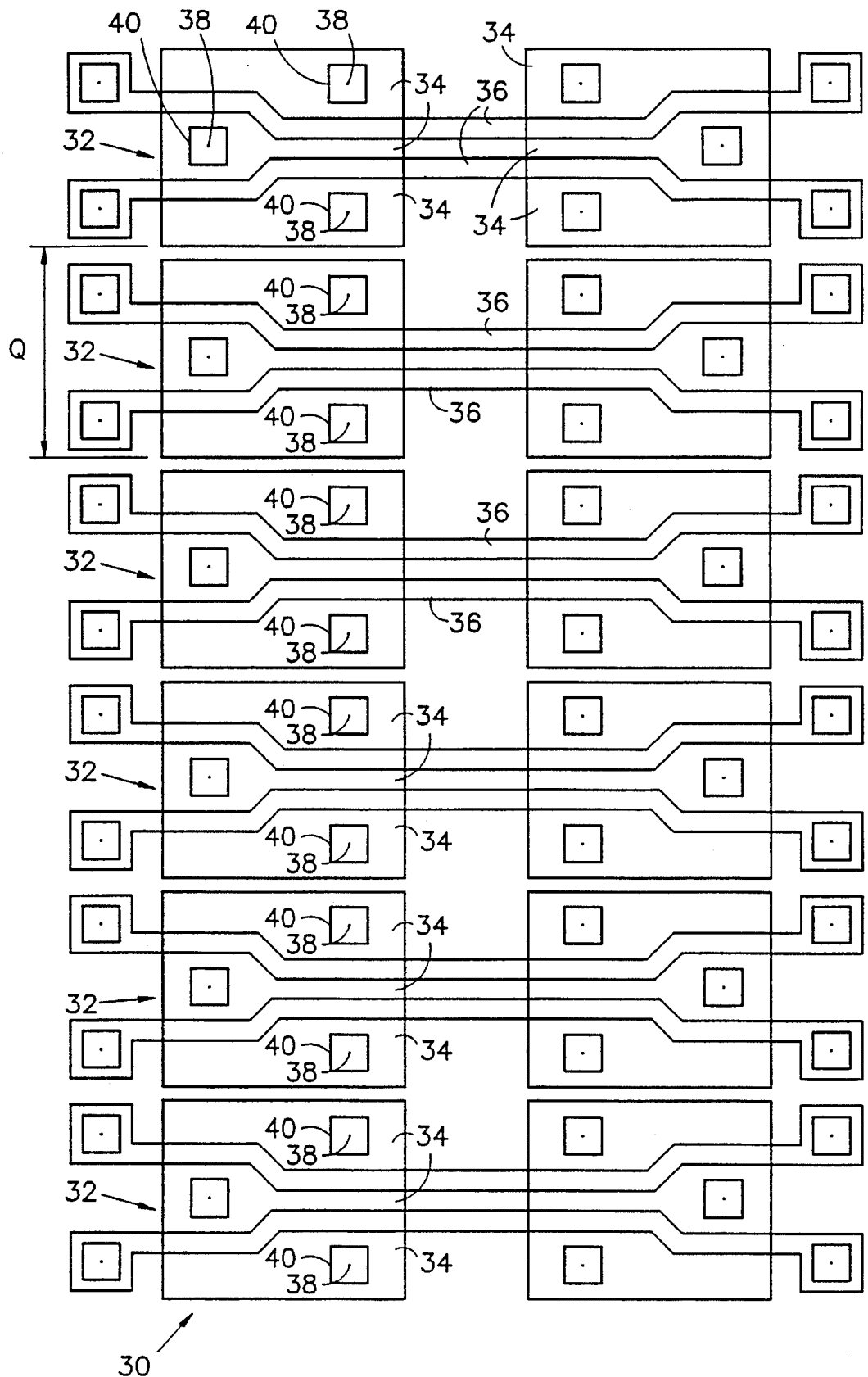
FIG. 2 is a simplified illustration of part of a gate array device constructed and operative in accordance with a preferred embodiment of the invention.

Reference is now made to FIG. 2, which is an illustration of part of a gate array device constructed and operative in accordance with a preferred embodiment of the present invention. What is shown in FIG. 2 is a column 30 of two-gate logic cells 32, wherein the pitch of the logic cells 32 along the column 30 is given as Q.

Each logic cell 32 includes a plurality of regions 34 of implanted semiconductor material which are separated from each other by conducting gates 36. The implanted semiconductor material regions 34 communicate with parallel contacts 38 located at contact sites 40. One contact is shown per region 34, but usually more contacts may be used.

It is noted that in contrast to the prior art, wherein a few sites 20 (FIG. 1) are arranged in parallel along the column, on each side of the logic cell 12, here fewer contact sites are provided on each side of the logic cell and these are arranged in an unstaggered arrangement. By virtue of the staggered arrangement, which is seen clearly in FIG. 2, the pitch Q of a logic cell having three regions 34 along column 30 is less than the pitch P (FIG. 1). Furthermore, the pitch Q is less than three times the length R of a region 14 plus gate 16 along column 10 of the prior art.

It is also noted that whereas in the prior art, the conducting gates 16 extend generally along a straight line perpendicular to columns 10, in the gate array according to the present invention, the conducting gates 36 include multiple bends to accommodate the staggered arrangement of contact sites 40.

Figure 3:
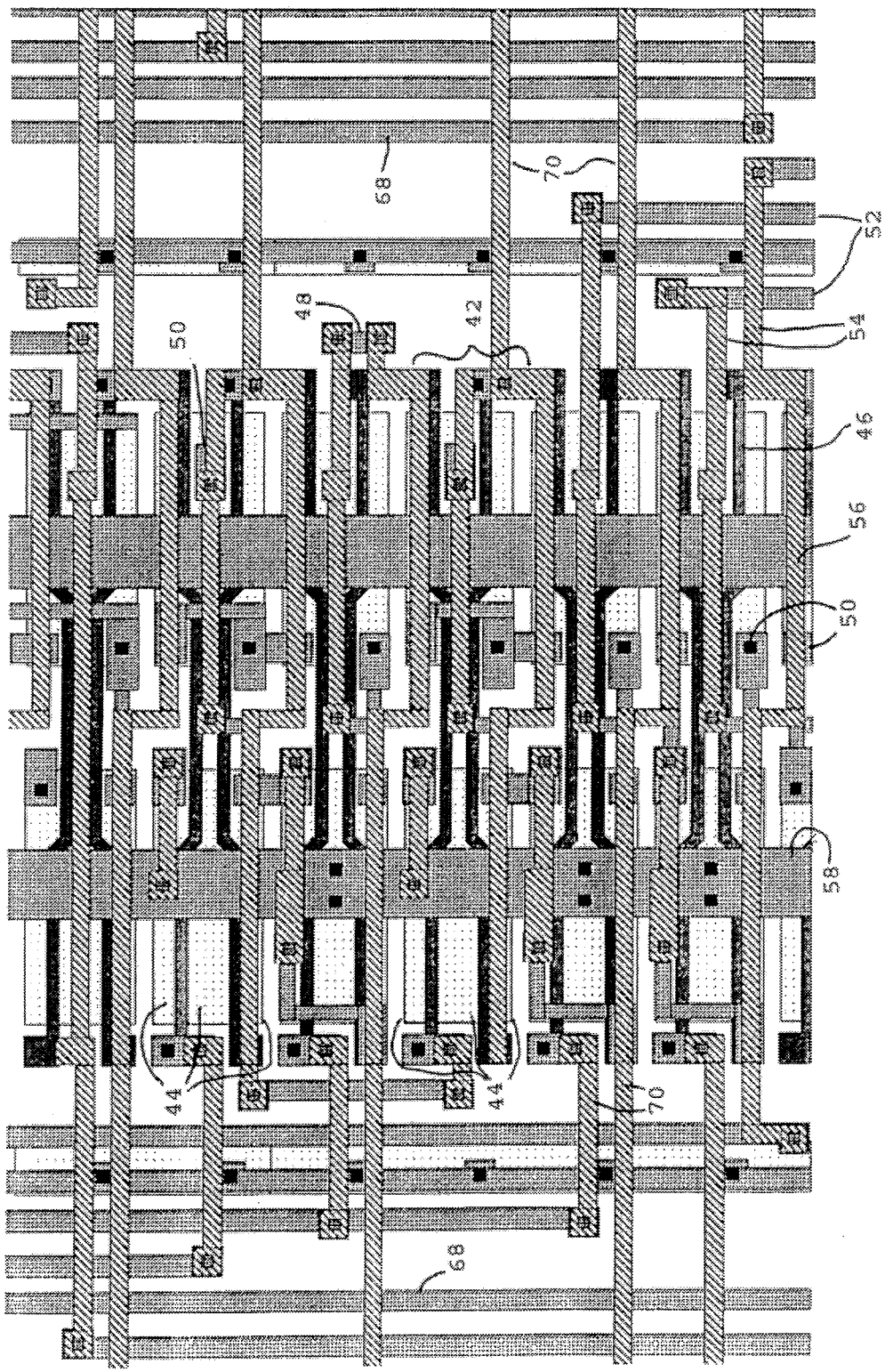
FIG. 3 is an enlarged illustration of part of the configuration of a gate array device constructed and operative in accordance with a preferred embodiment of the present invention.

Reference is now made to FIG. 3 which is a part of an actual layout of a gate array constructed and operative in accordance with a preferred embodiment of the present invention and which also includes an example of a metal interconnect. Logic cells are indicated by reference numeral 42, regions of implanted semiconductor material are indicated by reference numeral 44, conducting gates are indicated by reference numeral 46 and contacts by reference numerals 50.

A metal grid 48 interconnects logic cells 42 into clusters of macrocells. The metal grid comprises at least two metal layers, including a bottom metal layer M1 indicated by reference numeral 52 and at least one metal layer M2 therabove, indicated by reference numeral 54. The bottom layer 52 defines power lines 56 and ground lines 58.

Routing grids 68 interconnect clusters of logic cells 42, and communicate therewith via parallel metal tracks 70. It is a particular feature of the present invention, as seen in FIG. 3, that no more than two of the parallel metal tracks are employed to connect to each logic cell.

Figure 4:
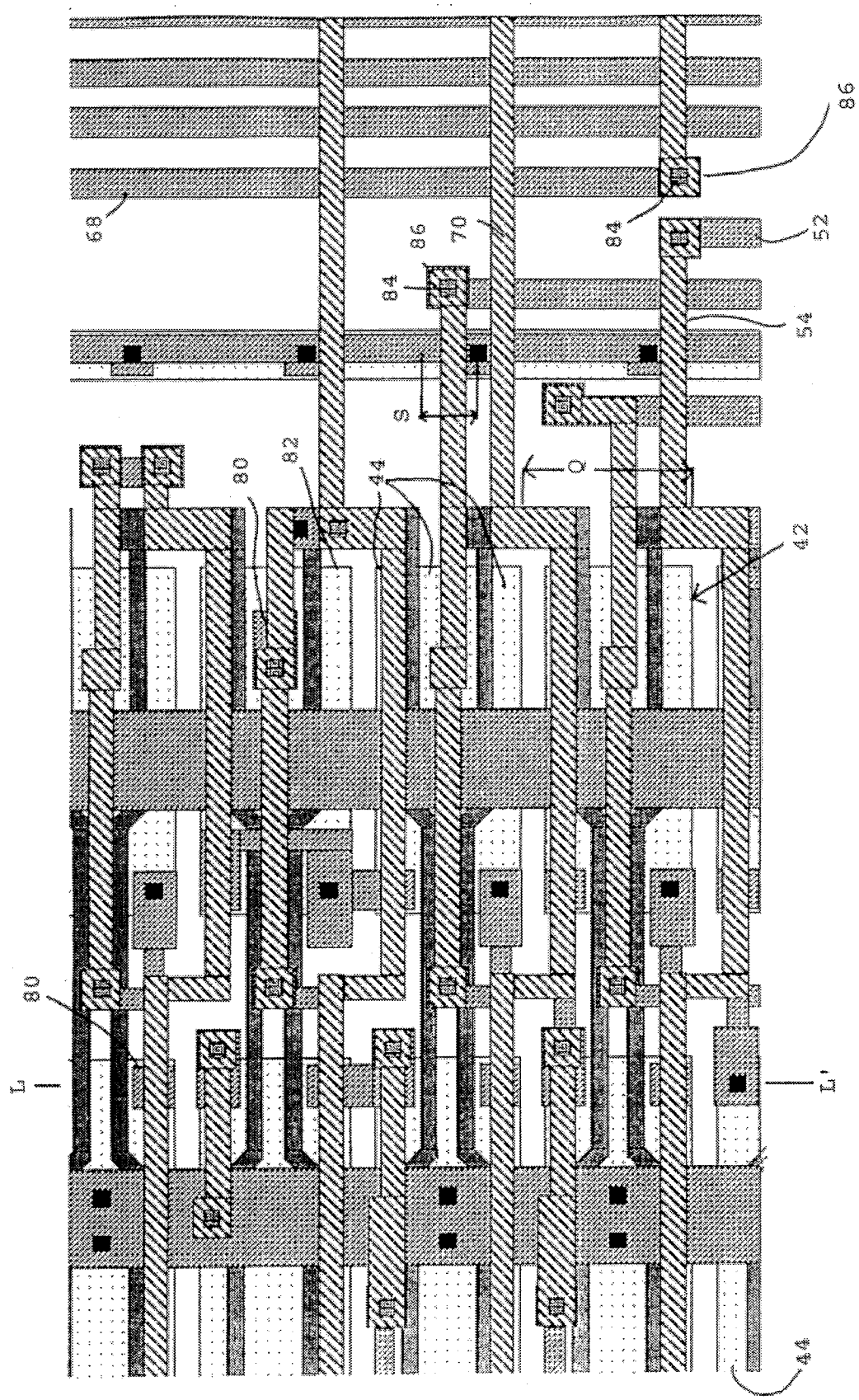
FIG. 4 is a further enlarged illustration of part of the configuration of FIG. 3.

Reference is now made to FIG. 4, which illustrates additional features of the gate array of FIG. 2. It is seen that there are a plurality of allowed contact sites, which conform to minimum dimensions allowed under given design rules. The allowed contact sites are indicated by reference numeral 80. Forbidden contact sites, which do not meet the minimum dimension requirements of the design rules are indicated by reference numeral 82.

There are also a plurality of vias 84 which provide electrical contacts between different metal layers such as M1 of layer 52 and M2 of layer 54. Vias are located at via sites 86. The minimum dimension of the via sites 86 required by the design rules are indicated by the envelope of the via site 86 of which extends to half the distance to the nearest neighbor unrelated metal layer. The requirement of an allowed via site is that an electrical contact can reliably be made between the two overlapping these metal layers and that none of these metals can unintentionally communicate with a parallel metal line or metal track.

The pitch between adjacent logic cells 42 along a column is indicated by Q, while the length of each via site 86 along the column is indicated by S. It is a particular feature of the present invention that the number of allowed via sites 86 along any line parallel to a column is less than the number of implanted semiconductor regions 44 along that same line. It is a further particular feature of the present invention that the number of allowed contact sites 80 along any such line as LL' parallel to a column is less than the number of implanted semiconductor regions 44 under that line.

Figure 5:
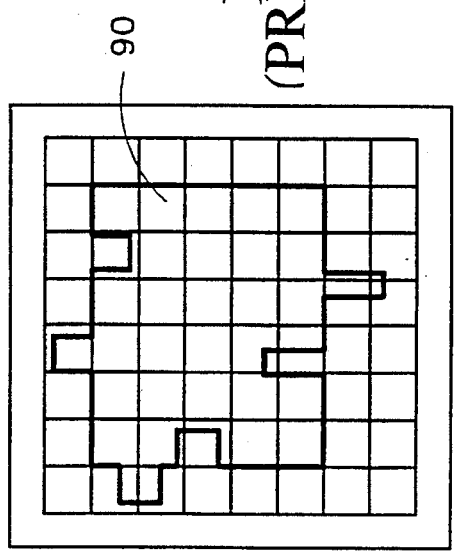
FIG. 5 is a conceptual illustration of gate array utilization in accordance with the prior art.
Figure 6:
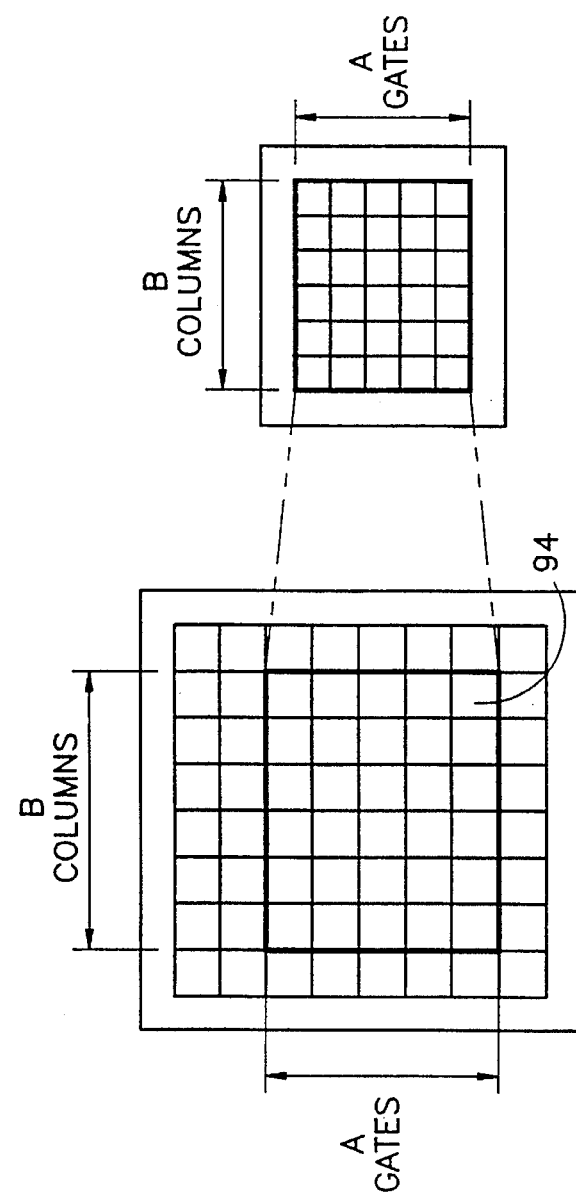
FIG. 6 is a conceptual illustration of mapping carried out in accordance with a preferred embodiment of the present invention.

Reference is now made to FIGS. 5 and 6 which illustrate a technique of mapping a programmable gate array of a relatively large size onto a mass-production gate array of a relatively small size in accordance with a preferred embodiment of the present invention.

FIG. 5 illustrates prior art gate array utilization wherein it is seen that selection of gates 90 to be used in a gate array of a given size is in accordance with rules which minimize interference between adjacent gates and not so as to locate all of the used gates within a given generally rectangular region.

FIG. 6 illustrates mapping in accordance with a preferred embodiment of the present invention, which preferably begins with selection of gates 94 to be used, such that they are all located within the smallest possible rectangular area in the gate array. Subsequent mapping, in accordance with a preferred embodiment of the invention, preserves the number of columns and number of logic sites per column of the rectangular area and enables resulting mapped gate array to be as compact as possible.

In accordance with a preferred embodiment of the present invention there is provided a method of producing a high density gate array including providing a programmable gate array, typically having an A×B rectangular area of programmed gates, programming the gate array and following programming of the gate array, modifying a computer file of the gate array as programmed, thereby to produce a modified computer file of a programmed gate array and employing the modified computer file to mass produce high density programmed gate arrays.

Additionally in accordance with a preferred embodiment of the present invention there is provided a method of mapping a relatively less compact gate array device into a relatively more compact gate array device including providing a relatively less compact gate array having a plurality of logic cells arranged along a given axis and a metal interconnect grid including a plurality of metal layers interconnected by vias at via sites, wherein each logic cell has a length spanning n via sites;

mapping the relatively less compact gate array onto a relatively more compact gate array wherein each logic cell has a length spanning no more than n–½ via sites.

Preferably, each of the logic cells in the relatively more compact gate array comprises a plurality of transistors whose width is reduced as compared with the width of a plurality of transistors employed in the logic cells of the relatively less compact gate array.

FIGS. 3 and 4 illustrate a preferred embodiment of the relatively more compact gate array which is achieved by mapping as foresaid.

It is appreciated that in a gate array of the so-called "continuous gate" design, a logic cell as described above refers to a pair of conducting gates with their adjacent implanted semiconductor material regions.

It is further appreciated that "metal lines" mentioned throughout the disclosure and claims may be constructed of a metallic substance or a substance of comparable electrical conductivity.

It will be appreciated by persons skilled in the art that the present invention is not limited by what has been particularly shown and described hereinabove. Rather the scope of the present invention is defined only by the claims which follow:

We claim:

1. A gate array device, useful either as a configurable gate array device or a compact gate array device, comprising:

an array of two-gate logic cells arranged in columns;

a metal grid interconnecting said logic cells into clusters of macrocells, said grid comprising a bottom metal layer and at least one metal layer disposed over the bottom metal layer;

power and ground lines formed of said bottom metal layer, extending generally parallel to said columns; and a routing grid interconnecting said clusters of macrocells, said routing grid comprising parallel metal tracks crossing said columns of logic cells, and wherein no more than two of said parallel metal tracks are employed to connect to each logic cell.

2. A compact gate array device comprising:

an array of logic cells arranged in columns, each including at least one channel, said logic cells each comprising a plurality of regions of implanted semiconductor material, said regions being separated from each other by conducting gates; and a metal grid interconnecting said logic cells and comprising at least two metal layers, said grid being connected to said regions of implanted semiconductor material at a plurality of generally uniformly sized contact sites, which are arranged in mutually staggered relationship along each channel within each logic cell.

3. Apparatus according to claim 2 and wherein the length of each channel is less than the number of contact sites in each channel multiplied by their dimension parallel to the channel.

4. A compact gate array device comprising:

an array of logic cells arranged in columns, each including at least one channel, said logic cells each comprising a plurality of regions of implanted semiconductor material, said regions being separated from each other by conducting gates; and a metal grid interconnecting said logic cells and comprising at least two metal layers, said grid being connected to said regions of implanted semiconductor material at selected ones of a plurality of generally uniformly sized allowed contact sites, the number of said allowed contact sites along any line parallel to said columns being less than the number of implanted semiconductor regions along said line.

5. Apparatus according to claim 4 and wherein intermediate each pair of contact sites along each such line parallel to said columns there exists at least one separate region whose dimension along said line is too short to accommodate a contact site thereat.

6. A compact gate array device comprising:

an array of logic cells arranged in columns, each including at least one channel, said logic cells each comprising a plurality of regions of implanted semiconductor material, said regions being separated from each other by conducting gates; and a metal grid interconnecting said logic cells and comprising at least two metal layers, said grid being connected to said regions of implanted semiconductor material at a plurality of generally uniformly sized contact sites, said at least two metal layers being interconnected at a plurality of generally uniformly sized via sites, and wherein the length of said columns is less than the number of said implant regions along a line parallel to said columns multiplied by the length of each via site along such line.

* * * * *